(12) United States Patent
Sonkar

(10) Patent No.: US 9,865,334 B2
(45) Date of Patent: Jan. 9, 2018

(54) EFFICIENT BITLINE DRIVEN ONE-SIDED POWER COLLAPSE WRITE-ASSIST DESIGN FOR SRAMS

(71) Applicant: Sysnopsys, Inc., Mountain View, CA (US)

(72) Inventor: Dharmesh Kumar Sonkar, Sunnyvale, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 15/367,710

(22) Filed: Dec. 2, 2016

(65) Prior Publication Data
US 2017/0243635 A1    Aug. 24, 2017

Related U.S. Application Data

(60) Provisional application No. 62/297,220, filed on Feb. 19, 2016.

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
CPC .... G11C 11/419; G11C 11/412; G11C 11/413
USPC ................................................. 365/154, 156
See application file for complete search history.

(56) References Cited

U.S. PATENT DOCUMENTS

| | | | |
|---|---|---|---|
| 7,266,010 B2 | 9/2007 | King | |
| 2012/0044779 A1* | 2/2012 | Chuang | G11C 11/412 365/226 |
| 2015/0098267 A1* | 4/2015 | Jain | G11C 7/12 365/154 |

* cited by examiner

*Primary Examiner* — Huan Hoang
(74) *Attorney, Agent, or Firm* — Bever, Hoffman & Harms, LLP (57) ABSTRACT

A voltage supply circuit for a memory cell including a first circuit coupled between a first voltage supply and a first voltage supply terminal of the memory cell, and a second circuit coupled between the first voltage supply and a second voltage supply terminal of the memory cell. The first circuit is controlled by a first bit line of the memory cell, and the second circuit is controlled by a second bit line of the memory cell. The first and second circuits provide the first supply voltage to the first and second voltage supply terminals of the memory cell, respectively, during a pre-charge phase. During a write operation, only one of the first circuit and the second circuit provides the first supply voltage to the memory cell, and the other one of the first circuit and the second circuit provides an adjusted voltage (e.g., a collapsed voltage) to the memory cell.

26 Claims, 8 Drawing Sheets

EFFICIENT BITLINE DRIVEN ONE-SIDED POWER COLLAPSE WRITE-ASSIST DESIGN FOR SRAMS

RELATED APPLICATION

The present application claims priority to U.S. Provisional Patent Application 62/297,220, entitled "An Efficient Bitline Driven One-Sided Power Collapse Write-Assist Design For SRAMs", filed on Feb. 19, 2016, and incorporated by reference herein

FIELD OF THE INVENTION

The present invention relates to memories that use a write assist technique that collapses a memory cell supply voltage during write operations.

RELATED ART

Due to advancing semiconductor processing technologies that result in shrinking minimum feature sizes, and the limitations of FinFETs associated with these technologies, writing to the bit cell of a memory has become extremely challenging at very low voltages.

In advanced technologies, there are two popular write-assist techniques, which include: (1) a negative bit-line method, and (2) a bit cell power supply (VDDA) collapse method. Because of reliability issues that exist in connection with the negative bit line method, the bit cell power supply collapse method is generally preferred. The bit cell power supply collapse method is described in more detail below.

Figure 1:
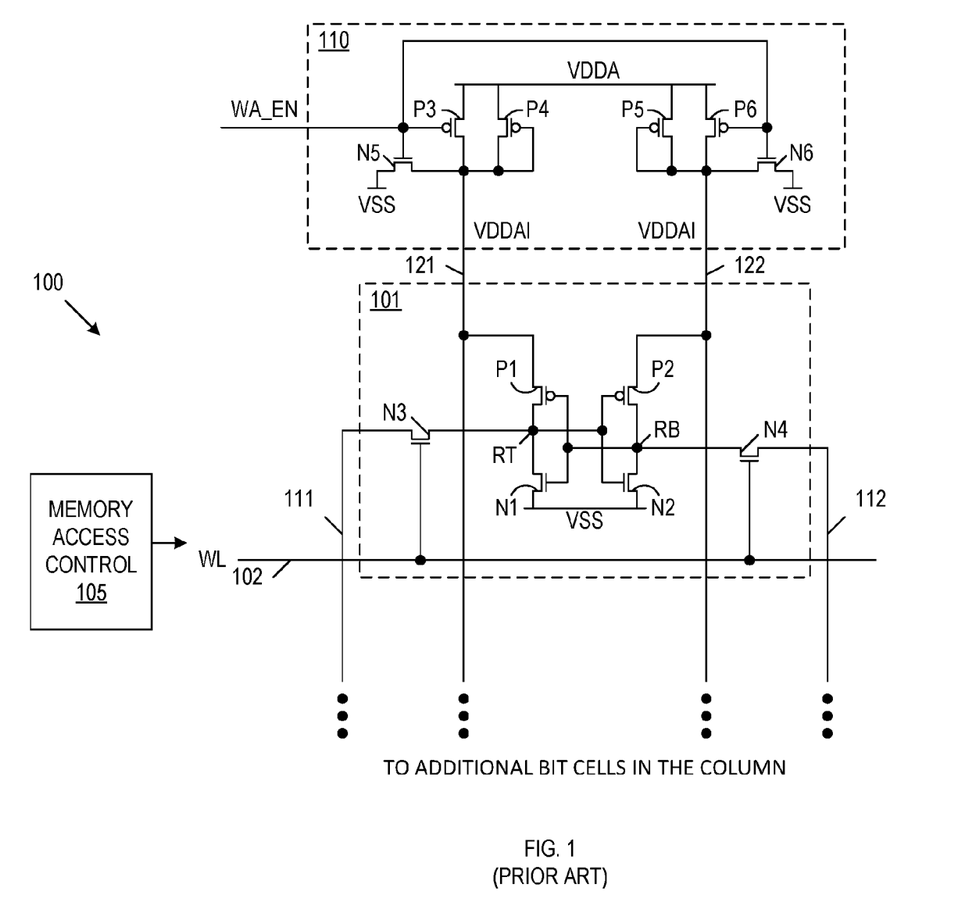
FIG. 1 is a circuit diagram of a portion of a conventional memory system.

FIG. 1 is a circuit diagram of a portion of a conventional memory system 100 that includes a static random access memory (SRAM) bit cell 101, memory access control circuitry 105, and write assist circuitry 110. SRAM bit cell 101 is a conventional memory cell that includes p-channel transistors P1-P2 and n-channel transistor N1-N4, which are connected as illustrated. In general, transistors P1-P2 and N1-N2 form cross-coupled inverters, wherein the sources of transistors P1 and P2 are coupled to receive a positive internal array supply voltage VDDAI from write assist circuitry 110 on internal array supply lines 121 and 122, respectively, and the sources of transistors N1-N2 are coupled to the ground (VSS) voltage supply. The internal storage nodes RT and RB of SRAM bit cell 101 are coupled to bit lines 111 and 112, respectively, through n-channel transistors N3 and N4, respectively. The gates of n-channel transistors N3 and N4 are coupled to word line 102. In order to enable access to SRAM cell 101 during read and write operations, the word line voltage WL on word line 102 is pulled up to a positive supply voltage VDDA.

SRAM bit cell 101 is part of a larger memory array (not shown), which includes multiple rows and columns of memory cells. Each row of memory cells is coupled to a corresponding word line (like word line 102) and each column of bit cells is coupled to a pair of corresponding bit lines (like bit lines 111-112) and the internal array supply lines 121 and 122 in a manner well known to those skilled in the art.

Figure 2:
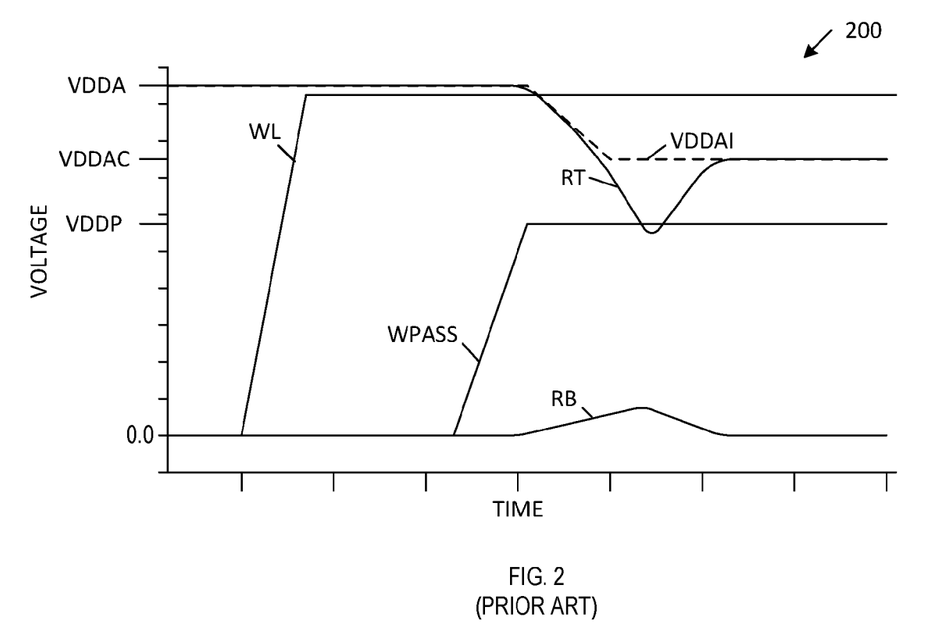
FIG. 2 is a waveform diagram illustrating a failed write operation to the conventional memory system of FIG. 1.

FIG. 2 is a waveform diagram 200 illustrating a write operation to bit cell 101. In the illustrated example, bit cell 101 initially stores a logic "1" value, wherein the voltages on internal storage nodes RT and RB are high and low, respectively. Under these conditions, the internal storage node RT is pulled up to the internal array supply voltage VDDAI through p-channel transistor P1, and the internal storage node RB is pulled down to the ground supply voltage VSS through n-channel transistor N2. Prior to the write operation, the write assist enable signal WA_EN is low (VSS), thereby turning on p-channel transistors P3 and P6 (and turning off p-channel transistors P4-P5 and n-channel transistors N5-N6), such that the internal array supply voltage VDDAI is pulled up to the full VDDA supply voltage. Also, prior to the write operation, the bit lines 111 and 112 are pre-charged to a periphery supply voltage VDDP, which is lower than the VDDA supply voltage, and higher than the ground supply voltage VSS.

To write a logic "0" value to the bit cell 101, the word line voltage WL is activated high (VDDA). Write data voltages are then established on the bit lines 111 and 112 using write drivers/access logic (not shown). In the present example, the bit lines 111 and 112 are driven to the ground supply voltage VSS and the periphery supply voltage VDDP, respectively. In general, the write data voltages are driven onto the bit lines 111 and 112 when memory access control circuitry 105 activates a write pass signal WPASS by driving this signal from the VSS supply voltage to the periphery supply voltage VDDP.

The write assist enable signal WA_EN is activated high (i.e., driven to the array supply voltage VDDA) at the same time the WPASS signal is activated high, thereby turning off p-channel transistors P3 and P6, and turning on p-channel transistors P4-P5 and weak n-channel transistors N5 and N6. Under these conditions, the internal array voltage VDDAI on array supply lines 121-122 is pulled down to a collapsed array supply voltage VDDAC, that is equal to the array supply voltage VDDA minus the threshold voltage (VTP) of p-channel transistor P4 (or p-channel transistor P5). This reduced array supply voltage VDDAC weakens the p-channel transistors P1 and P2 in the bit cell 101, which assists the flipping of the internal storage node RT from a logic "1" state to a logic "0" state. However, as illustrated by FIG. 2, it is possible that even with the reduced array supply voltage VDDAC, the state of the bit cell 101 may not flip in the manner desired.

At the end of the write operation (not shown), the write assist enable signal WA_EN is deactivated low, thereby turning on p-channel transistors P3 and P6 (and turning off transistors P4-P5 and N5-N6), and re-applying the array supply voltage VDDA to the internal array supply lines 121-122 (i.e., VDDAI=VDDA), such that the internal array supply lines 121-122 charge back up to the VDDA supply voltage.

The following problems are associated with the write operation illustrated by FIGS. 1 and 2. As described above, when the internal array voltage VDDAI is collapsed, both of the p-channel transistors P1-P2 of the bit cell 101 are weakened. This makes it more difficult for the p-channel transistor P2 to pull the voltage on the internal storage node RB up to a logic high voltage during the write operation.

In addition, the write time (e.g., the time required to flip the state of the bit stored by the bit cell) is always limited by the time required to pull a logic low internal bit cell node to a logic high state. In the described example, this corresponds to the time required for the internal storage node RB to transition from a logic '0' state to a logic '1' state. Thus, weakening the p-channel transistor P2 effectively lengthens the required write time of bit cell 101.

During the above described write operation, the internal array voltage supply lines 121-122 are both discharged from the array supply voltage VDDA to the collapsed voltage VDDAC (i.e., VDDA−VTP), and are subsequently charged from the collapsed voltage VDDAC to the array supply voltage VDDA. The capacitances of these supply lines 121-122 are large (and multiple columns are discharged/charged for a write operation), such that the charging/discharging of these supply lines 121-122 during write operations consumes significant power.

In addition, logic is required for tracking and synchronization of the write assist enable signal WA_EN with respect to the operation of the word line 102 and the bit lines 111-112. It is critical to ensure that the internal array supply voltage VDDAI is collapsed at exactly the right time during the write operation. As described above, to accomplish this, the write assist enable signal WA_EN must be activated at the same time as the WPASS signal. Synchronization of these signals is a critical design challenge. This control requires extra logic within memory access control circuitry 105, and therefore impacts the required layout area of the memory system 100, as well as timing within the memory system 100.

In memory systems that implement very low array supply voltages (VDDA), the 6-sigma variability (i.e., the variability in the memory system devices due to processing variations) can prevent ensuring the reliable write operations within the memory system 100, even when implementing the VDDA collapse described above.

It would therefore be desirable to have an improved system and method for reliably writing to a bit cell.

SUMMARY

Accordingly, the present invention provides a single-sided internal array voltage adjustment circuit for a memory cell including a first voltage adjustment circuit coupled between a first voltage supply and a first voltage supply terminal of the memory cell, and a second voltage adjustment circuit coupled between the first voltage supply and a second voltage supply terminal of the memory cell. The first voltage adjustment circuit is controlled by a voltage on a first bit line of the memory cell, and the second voltage adjustment circuit is controlled by a voltage on a second bit line of the memory cell. The first and second voltage adjustment circuits apply the first supply voltage to the first and second voltage supply terminals of the memory cell, respectively, during a pre-charge phase. However, during a write operation, only one of the first voltage adjustment circuit and the second voltage adjustment circuit provides the first supply voltage to power the memory cell, and the other one of the first voltage adjustment circuit and the second adjustment circuit provides another voltage (e.g., a collapsed voltage) to power the memory cell. For example, in an embodiment where the first supply voltage is a positive VDDA supply voltage, during a write operation, the first voltage adjustment circuit may provide the VDDA supply voltage to the first voltage supply terminal of the memory cell, and the second voltage adjustment circuit may provide a collapsed supply voltage VDDAC to the second voltage supply terminal of the memory cell, wherein the collapsed supply voltage VDDAC is less than the VDDA supply voltage by a transistor threshold voltage (VTP). In an alternate embodiment, wherein the first supply voltage is ground (VSS), during a write operation, the first voltage adjustment circuit may provide the ground supply voltage VSS to the first voltage supply terminal of the memory cell, and the second voltage adjustment circuit may provide a boosted supply voltage to the second voltage supply terminal of the memory cell, wherein the boosted supply voltage is greater than the ground supply voltage VSS by a transistor threshold voltage (VTN).

Adjusting the supply voltage on only one side of the memory cell advantageously weakens only one transistor of the memory cell, effectively shortening the time required to complete the write operation. In addition, because only one of the first and second voltage supply terminals of the memory cell is discharged/charged during the write operation, the dynamic power requirements of the write operation are minimized. Moreover, because the first and second voltage adjustment circuits are controlled by the voltages on the bit lines, the associated write access control circuitry may be simplified.

The present invention will be more fully understood in view of the following description and drawings.

DETAILED DESCRIPTION

Figure 3:
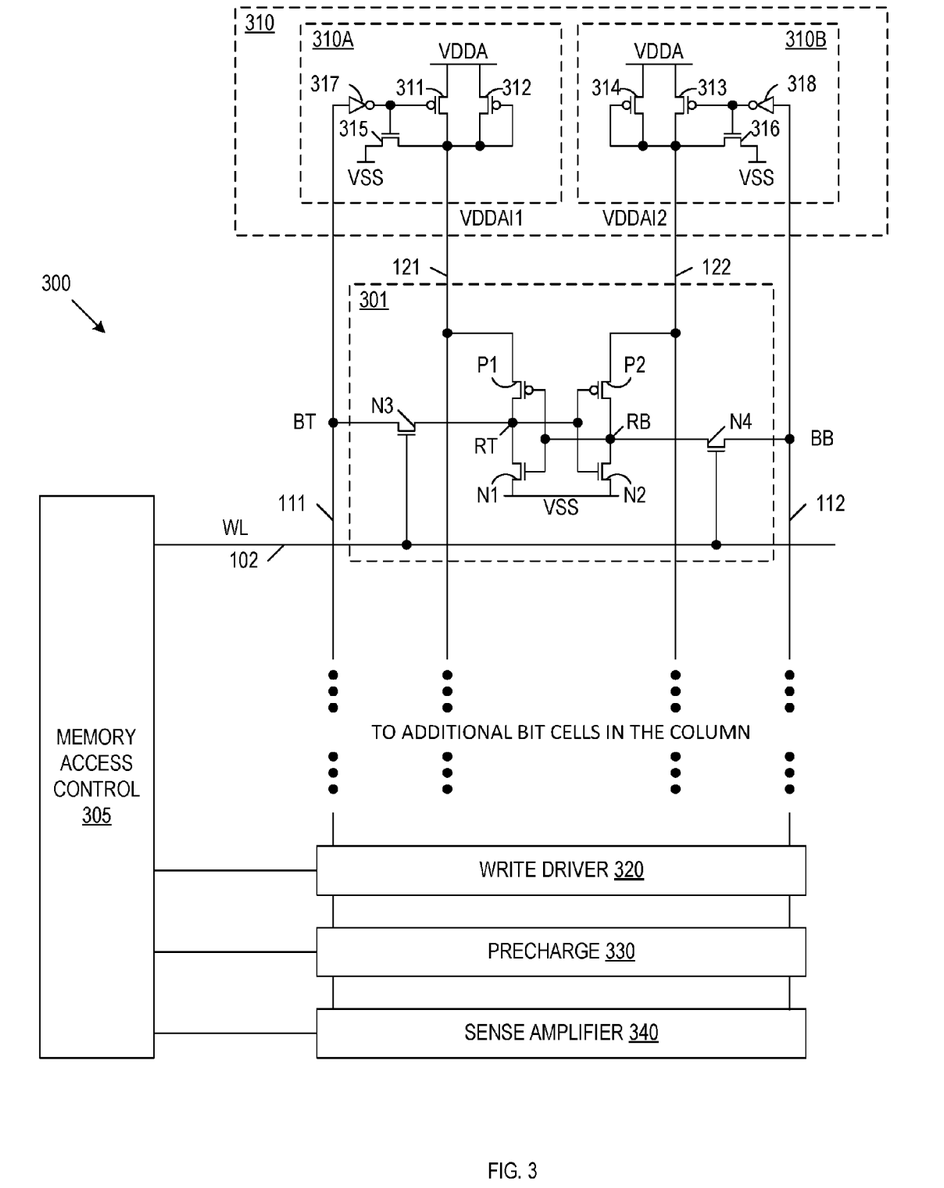
FIG. 3 is a circuit diagram of a portion of a memory system in accordance with one embodiment of the present invention.

FIG. 3 is a circuit diagram of a portion of a memory system 300 in accordance with one embodiment of the present invention. Similar elements in memory system 300 and memory system 100 (FIG. 1) are labeled with similar reference numbers. Thus, memory system 300 includes SRAM bit cell 301, which includes p-channel transistors P1-P2 and n-channel transistors N1-N4, which are connected in the manner described above in connection with FIG. 1. Bit cell 301 is coupled to bit lines 111-112 and word line 102 as illustrated. Additional bit cells (not shown) in the same column as bit cell 301 are similarly coupled to bit lines 111-112 in a manner known in the art. It is understood that these additional bit cells will have corresponding word lines (not shown).

Memory system 300 also includes memory access control circuitry 305, single-sided internal array voltage adjustment circuit 310, write driver circuitry 320, bit line pre-charge circuitry 330 and sense amplifier circuitry 340.

Single-sided internal array voltage adjustment circuit 310, write driver circuitry 320, bit line pre-charge circuitry 330 and sense amplifier circuitry 340 are each coupled to the bit lines 111-112. As described in more detail below, memory access control circuitry 305 controls the operation of memory system 300 by controlling the operation of word line 102, write driver circuitry 320, bit line pre-charge circuitry 330 and sense amplifier circuitry 340. Advantageously, memory access control circuitry 305 does not need to directly control the operation of single-sided internal array voltage adjustment circuit 310.

Single-sided internal array voltage adjustment circuit 310 includes a first voltage adjustment circuit 310A and an independent second voltage adjustment circuit 310B. First voltage adjustment circuit 310A includes p-channel transistors 311-312, n-channel transistor 315 and inverter 317. Second voltage adjustment circuit 310B includes p-channel transistors 313-314, n-channel transistor 316 and inverter 318. Inputs of inverters 317 and 318 are coupled to bit lines 111 and 112, respectively. The output of inverter 317 is coupled to the gates of transistors 311 and 315, and the output of inverter 318 is coupled to the gates of transistors 313 and 316. P-channel transistors 311 and 312 are coupled in parallel between the array supply voltage VDDA and the internal array supply voltage line 121. Similarly, p-channel transistors 313 and 314 are coupled in parallel between the array supply voltage VDDA and the internal array supply voltage line 122. Note that the internal array supply voltage lines 121 and 122 may also be characterized as voltage supply terminals of the bit cell 301. N-channel transistor 315 is coupled between the ground supply voltage VSS and the internal array supply voltage line 121. Similarly, n-channel transistor 316 is coupled between the ground supply voltage VSS and the internal array supply voltage line 122. The gates of p-channel transistors 312 and 314 are coupled to the internal array supply voltage lines 121 and 122, respectively. As described in more detail below, the configuration of single-sided internal array voltage adjustment circuit 310 advantageously allows the voltage to be collapsed on only one of the internal array supply voltage lines 121 or 122 during a write operation. The voltages on internal array supply voltage lines 121 and 122 are designated as internal array supply voltages VDDAI1 and VDDAI2, respectively.

Figure 4A:
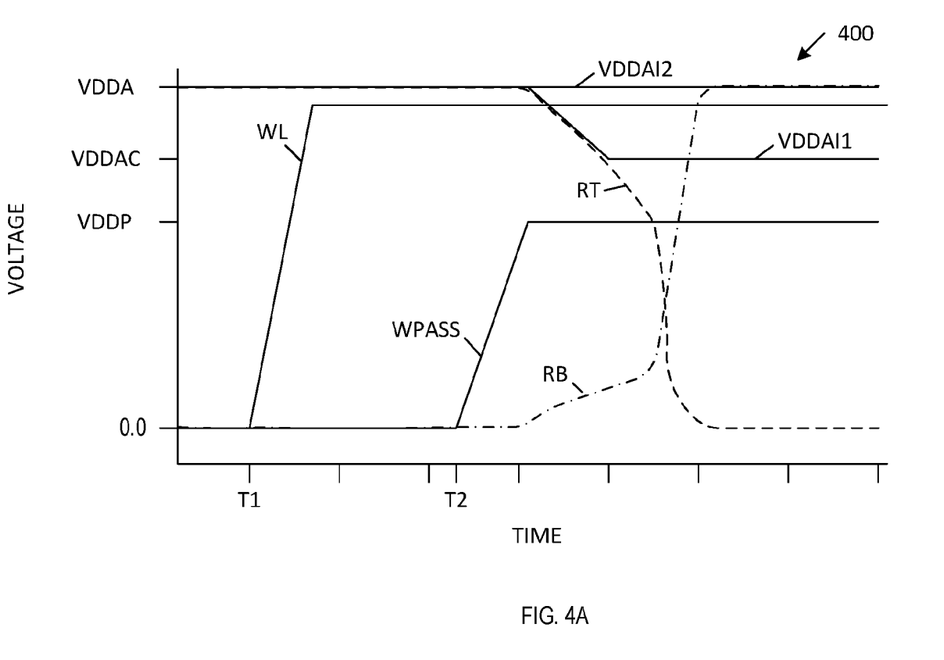
FIG. 4A is a waveform diagram illustrating a write operation to the memory system of FIG. 3 in accordance with one embodiment of the present invention.
Figure 4B:
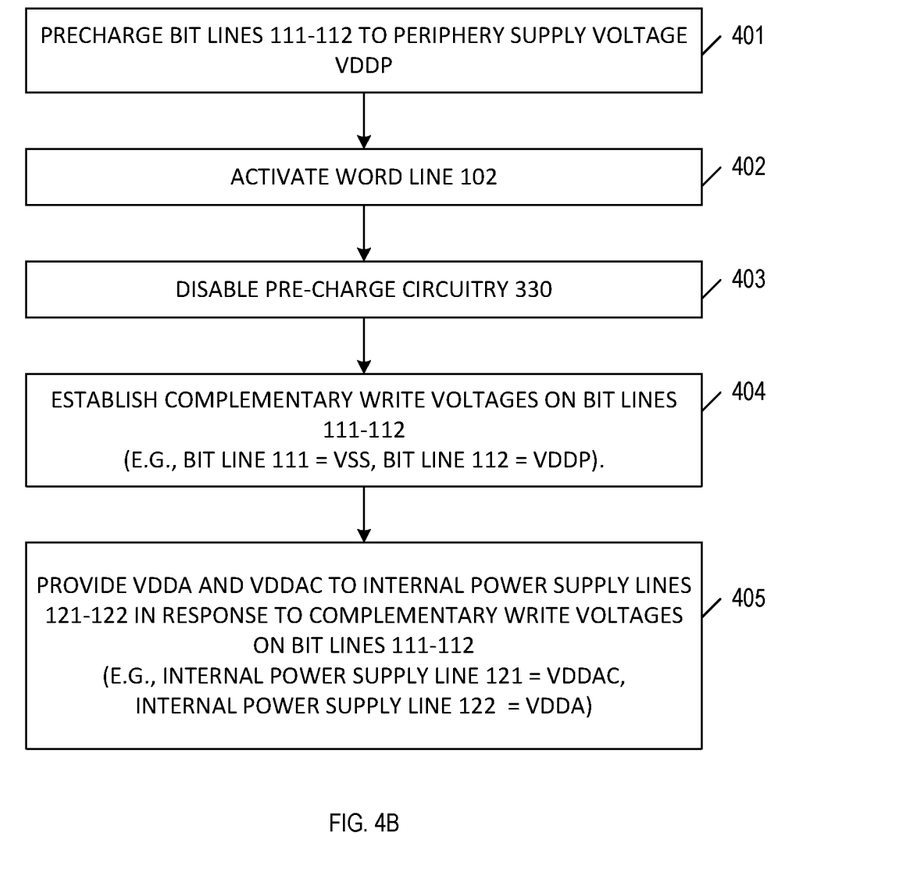
FIG. 4B is a flow diagram illustrating various steps associated with the write operation of FIG. 4A in accordance with one embodiment of the present invention.

A write operation to bit cell 301 will now be described. FIG. 4A is a waveform diagram 400 illustrating a write operation to bit cell 301 in accordance with one embodiment. FIG. 4B is a flow diagram illustrating various steps 401-405 associated with the write operation to bit cell 301.

In the described write operation, bit cell 301 initially stores a logic "1" value, wherein the voltages on internal storage nodes RT and RB are high and low, respectively. Under these conditions, the internal storage node RT is pulled up to the internal array supply voltage VDDAI1 through p-channel transistor P1, and the internal storage node RB is pulled down to the ground supply voltage VSS through n-channel transistor N2. Prior to the write operation, the bit lines 111 and 112 are pre-charged to a periphery supply voltage VDDP, which is lower than the VDDA supply voltage, and higher than the ground supply voltage VSS (401). The periphery supply voltage VDDP on bit lines 111-112 is sufficiently high to cause inverters 317 and 318 to drive logic low (VSS) output voltages to the gates of p-channel transistors 311 and 313, respectively. Under these conditions, p-channel transistors 311 and 313 turn on (and p-channel transistors 312 and 314, and n-channel transistors 315-316 turn off), such that the internal array supply voltages VDDAI1 and VDDAI2 are pulled up to the full VDDA supply voltage.

To write a logic "0" value to the bit cell 301, memory access control circuitry 305 activates the word line voltage WL high (VDDA) at time T1 (402). At this time, memory access control circuitry 305 also controls the pre-charge circuitry 330 to isolate the bit lines 111-112 from the pre-charge voltage VDDP (403). Memory access control circuitry 305 also provides the write data voltage(s) to write driver circuitry 320. Memory access control circuitry 305 may cause sense amplifier 340 to be isolated from the bit lines during the write operation. Alternately, the sense amplifier 340 can be activated to help boost the write voltages developed on bit lines 111-112 during the write operation. Exemplary methods for enabling the sense amplifier 340 to boost the write voltages on bit lines 111-112 are described in commonly owned, co-pending U.S. patent application Ser. No. 14/832,968, which is hereby incorporated by reference in its entirety.

At time T2, memory access control circuitry 305 activates a write pass signal WPASS by driving this signal from the VSS supply voltage to the periphery supply voltage VDDP. The activated write pass signal WPASS causes the write driver 320 to drive the complementary write voltages onto bit lines 111-112. In the described write operation, write driver 320 drives the bit lines 111 and 112 to the ground supply voltage VSS and the periphery supply voltage VDDP, respectively (404).

As the bit line 111 is driven to the ground supply voltage VSS, the output of inverter 317 is driven to a logic high state, thereby turning off p-channel transistor 311, and turning on n-channel transistor 315 and p-channel transistor 312. Under these conditions, the internal array voltage VDDAI1 on array supply line 121 is pulled down to a collapsed array supply voltage VDDAC, that is equal to the array supply voltage VDDA minus the threshold voltage (VTP) of p-channel transistor 313. This voltage drop may also be referred to as a diode voltage drop. This reduced array supply voltage VDDAC weakens the p-channel transistor P1 in the bit cell 301 which assists the flipping of the internal storage node RT from a logic "1" state to a logic "0" state.

Note that during the described write operation, bit line 112 remains at the periphery supply voltage VDDP. As a result, the output of inverter 318 remains low, and the internal array voltage VDDAI2 provided on array supply line 122 remains at the full VDDA supply voltage. Under these conditions, the p-channel transistor P2 of bit cell 302 remains strong, thereby allowing this transistor P2 to readily pull the voltage on internal storage node RB up from the VSS ground supply voltage to the VDDA supply voltage.

At the end of the write operation (not shown), memory access control circuitry 305 deactivates the word line voltage WL to the ground supply voltage (VSS), disables the write driver circuitry 320, and activates the bit line pre-charge circuit 330, such that the bit lines 111-112 are pre-charged to the periphery supply voltage VDDP. As a result, the output of inverter 317 is driven back to a low state (VSS), thereby turning on p-channel transistor 311 (and turning off transistors 312 and 315), such that the full array supply voltage VDDA is provided on the internal array supply line 121 (i.e., VDDAI1=VDDA). At this time, the internal array supply line 121 charges back up to the VDDA supply voltage. Note that the internal array supply line 122 remained at the VDDA supply voltage for the entire write operation.

The single-sided internal array voltage adjustment circuit 310 improves upon the conventional write assist technique of FIGS. 1 and 2 by pulling down the array supply voltage for only half of the bit cell 301. Only the p-channel transistor coupled to the internal storage node being driven to a logic low state (VSS) is weakened during the write operation. Because the p-channel transistor coupled to the internal storage node being driven to a logic high state is not weakened during the write operation, the effective write time improves, because this internal storage node will have a full VDDA voltage supply. This advantageously improves the cycle time of the memory.

The single-sided internal array voltage adjustment circuit 310 is controlled by the write voltages established on the associated bit lines 111 and 112, which are already in synchronization with the word line voltage WL by design. Thus, additional circuitry and design effort is not required to tune the voltage adjustment circuit 310 to match the voltages on the word line 102 and the bit lines 111-112. This reduces the layout area requirement of memory access control circuitry 305 (and therefore memory system 300).

Moreover, because only half of the array supply voltage VDDA is collapsing during a write operation, the power usage is reduced (with respect to FIGS. 1 and 2) during the write operation. More specifically, the amount of VDD capacitance discharge is reduced by about 50 percent compared to collapse circuit 110 (FIG. 1). This advantageously reduces the dynamic power required to perform the write operation. In the above-described manner, voltage adjustment circuit 310 provides improvements in power, performance and required layout area of memory system 300.

A read operation of bit cell 301 will now be described. This read operation assumes that the internal node RT is initially held at a logic high state (VDDA), and the internal node RB is initially held at a logic low state (VSS). Bit lines 111 and 112 are initially pre-charged to the periphery supply voltage VDDP. Write driver circuitry 320 is disabled. Memory access control logic 305 activates the word line WL high (VDDA), disables the pre-charge control circuitry 330, and enables the sense amplifier 340. Under these conditions, a differential signal is developed across the bit lines 111-112, based on the contents of the bit cell 301. Sense amplifier 340 senses the differential signal across the bit lines 111-112. In the described example, the voltage on bit line 112 will be pulled about 50 to 100 mV lower than the voltage on bit line 111. Note that the read voltages on bit lines 111-112 do not drop low enough to cause inverters 317-318 to flip (i.e., inverters 317-318 continue to drive logic low output signals in response to the read voltages developed on bit lines 111-112). If the inverter 318 were to flip due to the reduced voltage on bit line 112 during the read operation, the internal array supply voltage VDDAI2 on internal array supply line 122 would collapse (to VDDAC=VDDA−VTP). However, under these conditions, the associated p-channel transistor P2 in the bit cell is in an 'off' state, such that the discharge of bit line 112 is not adversely impacted. Moreover, collapsing the internal array supply voltage VDDAI2 on line 122 will help reduce leakage current in the other bit cells in the same column as bit cell 301, which improves the associated read current. The supply diode structures present within voltage adjustment circuit 310 are selected to maintain the VDDAI1 and VDDAI2 supply voltages at the minimum retention voltage of bit cell 301.

Figure 5:
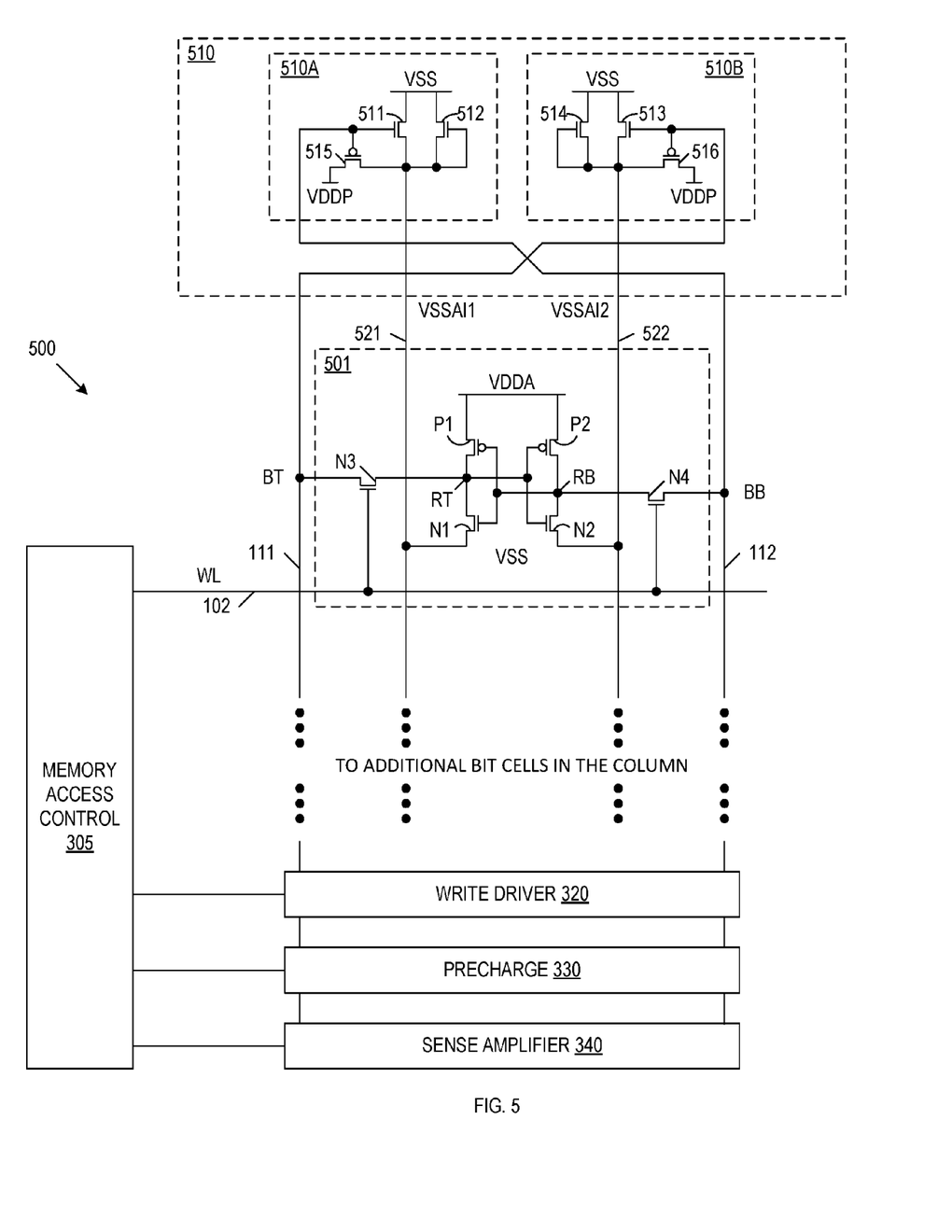
FIG. 5 is a circuit diagram of a portion of a memory system in accordance with an alternate embodiment of the present invention.

FIG. 5 is a circuit diagram of a memory system 500 in accordance with an alternate embodiment. In this embodiment, the above-suggested implementation is effectively inverted and applied using the ground supply voltage (VSS). Similar elements in FIGS. 3 and 5 are labeled with similar reference numbers. Memory system includes a single-ended write voltage adjustment circuit 510, which includes a first voltage adjustment circuit 510A and a second voltage adjustment circuit 510B. First voltage adjustment circuit 510A includes n-channel transistors 511-512 and p-channel transistor 515. Second voltage adjustment circuit 510B includes n-channel transistors 513-514 and p-channel transistor 516. Bit line 112 is coupled to the gates of transistors 511 and 515, and bit line 111 is coupled to the gates of transistors 513 and 516. N-channel transistors 511 and 512 are coupled in parallel between the ground supply voltage VSS and the internal array supply voltage line 521. Similarly, n-channel transistors 513 and 514 are coupled in parallel between the ground supply voltage VSS and the internal array supply voltage line 522. P-channel transistor 515 is coupled between the periphery supply voltage VDDP and the internal array supply voltage line 521. Similarly, P-channel transistor 516 is coupled between the periphery supply voltage VDDP and the internal array supply voltage line 522. The gates of n-channel transistors 512 and 514 are coupled to the internal array supply voltage lines 521 and 522, respectively. The internal array supply voltage lines 521 and 522 are coupled to the sources of n-channel transistors N1 and N2 within bit cell 501 (and the corresponding n-channel transistors in other bit cells in the same column). The voltages on internal array supply voltage lines 521 and 522 are designated as internal array supply voltages VSSAI1 and VSSAI2, respectively. Note that the internal array supply voltage lines 521 and 522 may also be characterized as voltage supply terminals of the bit cell 501.

Figure 6A:
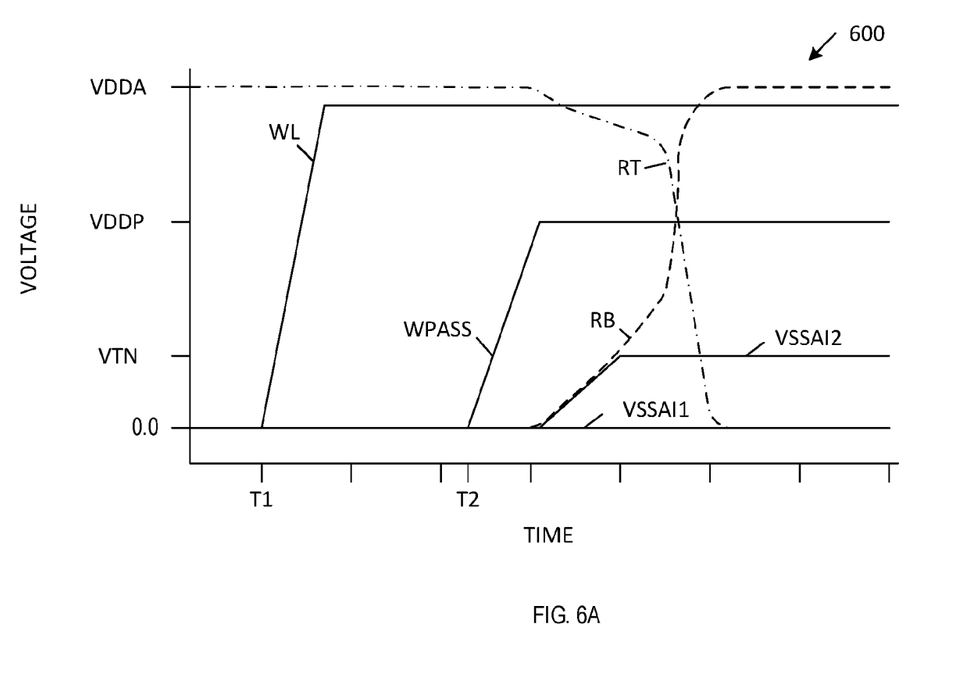
FIG. 6A is a waveform diagram illustrating a write operation to the memory system of FIG. 5 in accordance with one embodiment of the present invention.
Figure 6B:
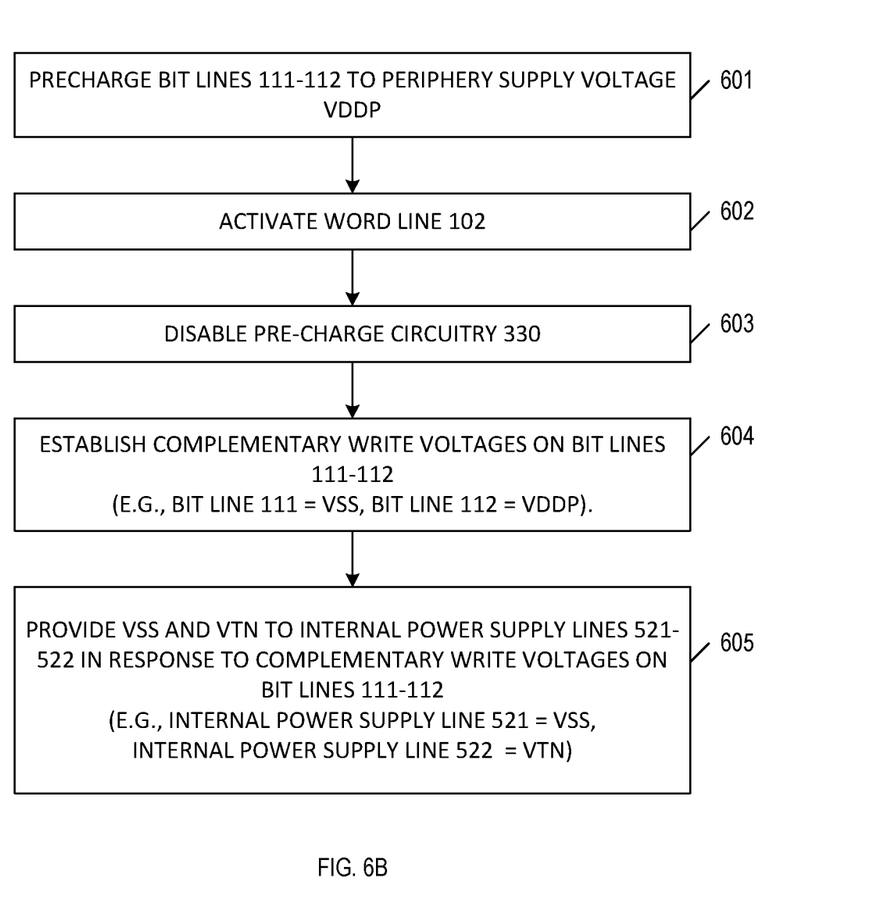
FIG. 6B is a flow diagram illustrating various steps associated with the write operation of FIG. 6A in accordance with one embodiment of the present invention.

FIG. 6A is a waveform diagram illustrating a write operation in the memory system 500 in accordance with one embodiment. FIG. 6B is a flow diagram illustrating various steps 601-605 associated with the write operation to bit cell 501. Single-ended write voltage adjustment circuit 510 operates in a similar manner as voltage adjustment circuit 310 (FIG. 3). However, rather than collapsing the VDDA supply voltage on one of the internal array supply lines during a write operation, voltage adjustment circuit 510 'raises' the VSS supply voltage on one of the internal array supply lines during a write operation. In the example of FIGS. 6A and 6B, bit cell 501 initially stores a logic high voltage (VDDA) on the internal storage node RT, and a logic low voltage (VSS) on the internal storage node RB. A write operation (to write a logic '0' value to internal storage node RT) proceeds in the manner described above in connection with FIGS. 4A and 4B, wherein the bit lines 111-112 are pre-charged to the periphery supply voltage VDDP by pre-charge circuitry 330 (601), the word line voltage WL is activated high (VDDA) by the memory access control circuitry 305 (602), the pre-charge circuitry 330 is disabled (603), and the write driver circuitry 320 drives the write data voltages onto the bit lines 111 and 112 (604). The low (VSS) write voltage on bit line 111 causes n-channel transistor 513 to turn off, and also causes p-channel transistor 516 and n-channel transistor 514 to turn on. As a result, the internal array supply voltage VSSAI2 on line 522 is pulled up to a voltage that is greater than the ground supply voltage VSS by a value equal to the threshold voltage (VTN) of n-channel transistor 514 (605). The high (VDDP) write voltage on bit line 112 causes n-channel transistor 511 to remain on, such that the internal array supply voltage VSSAI1 on line 521 remains at the ground supply voltage VSS (605). These conditions help the write operation in two ways. First, the p-channel transistor P1 associated with the internal node RT being written to a logic low voltage becomes weak, because the gate of this transistor P1 is coupled to receive the increased voltage VSSAI2 (VTN) (rather than VSS) through n-channel transistor N2. Note that the increased voltage VSSAI2 is applied to the internal node RB through the turned on n-channel transistor N2. Second, because the write operation will eventually cause the internal node RB to transition to a logic high voltage, raising the voltage of the internal node RB assists the write operation. Note that the NMOS diode structures formed by transistors 511-514 are selected to maintain the voltages VSSAI1 and VSSAI2 at a minimum retention voltage of the bit cell 501.

Although illustrative embodiments of the invention have been described in detail herein with reference to the accompanying figures, it is to be understood that the invention is not limited to those precise embodiments. Thus, the scope of the invention is defined by the following claims and their equivalents.

I claim:

1. A voltage supply circuit for a memory cell comprising:
   a first circuit coupled between a first voltage supply and a first voltage supply terminal of the memory cell, wherein the first circuit is coupled to and controlled by a first bit line of the memory cell, wherein the first circuit comprises:
      a first transistor having a first conductivity type coupled between the first voltage supply and the first voltage supply terminal of the memory cell;
      a second transistor having the first conductivity type coupled between the first voltage supply and the first voltage supply terminal of the memory cell, wherein the second transistor includes a gate coupled to the first voltage supply terminal of the memory cell; and
      a third transistor having a second conductivity type coupled between a second voltage supply and the first voltage supply terminal of the memory cell, wherein the first transistor and the third transistor include gates coupled to the first bit line of the memory cell; and
   a second circuit coupled between the first voltage supply and a second voltage supply terminal of a memory cell, wherein the second circuit is coupled to and controlled by a second bit line of the memory cell.

2. The voltage supply circuit of claim 1, wherein the first circuit is configured to provide a first supply voltage to the first voltage supply terminal of the memory cell during a pre-charge phase of the memory cell, and the second circuit is configured to provide the first supply voltage to the second voltage supply terminal of the memory cell during the pre-charge phase of the memory cell.

3. The voltage supply circuit of claim 1, wherein one and only one of the first circuit and the second circuit provides the first supply voltage to the memory cell during a write operation, and the other one of the first circuit and the second circuit provides a voltage other than the first supply voltage to the memory cell during the write operation.

4. The voltage supply circuit of claim 1, further comprising a first inverter having an input coupled to the first bit line of the memory cell, and an output coupled to the gates of the first transistor and the third transistor.

5. The voltage supply circuit of claim 1, wherein the second circuit comprises:
   a fourth transistor having the first conductivity type coupled between the first voltage supply and the second voltage supply terminal of the memory cell;
   a fifth transistor having the first conductivity type coupled between the first voltage supply and the second voltage supply terminal of the memory cell, wherein the fifth transistor includes a gate coupled to the second voltage supply terminal of the memory cell;
   a sixth transistor having the second conductivity type coupled between the second voltage supply and the second voltage supply terminal of the memory cell, wherein the fourth transistor and the sixth transistor include gates coupled to the second bit line of the memory cell.

6. The voltage supply circuit of claim 1, wherein the first voltage supply provides a positive supply voltage to the first circuit.

7. The voltage supply circuit of claim 6, wherein the first circuit provides the positive supply voltage to the first voltage supply terminal of the memory cell when a voltage on the first bit line has a high logic state, and the first circuit provides a reduced positive voltage, less than the positive supply voltage to the first voltage supply terminal of the memory cell when a voltage on the first bit line has a logic low state.

8. The voltage supply circuit of claim 7, wherein the second circuit provides the positive supply voltage to the second voltage supply terminal of the memory cell when a voltage on the second bit line has a high logic state, and the second circuit provides a reduced positive voltage, less than the positive supply voltage to the second voltage supply terminal of the memory cell when a voltage on the second bit line has a logic low state.

9. The voltage supply of claim 7, wherein the reduced positive voltage is less than the positive supply voltage by a transistor threshold voltage.

10. The voltage supply circuit of claim 1, wherein the first voltage supply provides a ground voltage to the first circuit.

11. The voltage supply circuit of claim 10, wherein the first circuit provides the ground voltage to the first voltage supply terminal of the memory cell when a voltage on the first bit line has a high logic state, and the first circuit provides a positive voltage, greater than the ground voltage to the first voltage supply terminal of the memory cell when a voltage on the first bit line has a logic low state.

12. The voltage supply circuit of claim 11, wherein the second circuit provides the ground voltage to the second voltage supply terminal of the memory cell when a voltage on the second bit line has a high logic state, and the second circuit provides a positive voltage, greater than the ground voltage to the second voltage supply terminal of the memory cell when a voltage on the second bit line has a logic low state.

13. The voltage supply of claim 11, wherein the positive voltage is greater than the ground voltage by a transistor threshold voltage.

14. The voltage supply circuit of claim 1, wherein
   the first voltage supply terminal provides power to a first inverter of the memory cell; and
   the second voltage supply terminal provides power to a second inverter of the memory cell.

15. The voltage supply circuit of claim 1, wherein
   the first voltage supply terminal applies a first internal array voltage to a source of a first transistor of the memory cell; and
   the second voltage supply terminal applies a second internal array voltage to a source of a second transistor of the memory cell.

16. A method for operating a memory cell comprising:
   establishing a first write voltage on a first bit line coupled to the memory cell;
   establishing a second write voltage on a second bit line coupled to the memory cell;
   turning on a first transistor in response to the first write voltage on the first bit line, wherein the first transistor is coupled between a first voltage supply and a first internal power supply line of the memory cell, such that the turned on first transistor provides a first voltage to the first internal power supply line of the memory cell; and turning on a second transistor and a third transistor in response to the second write voltage on the second bit line, wherein the second transistor is coupled between the first voltage supply and a second internal power supply line of the memory cell, and the third transistor is coupled between a second voltage supply and the second internal power supply line of the memory cell, such that the turned on second and third transistors provide a second voltage to a second internal power supply line of the memory cell, wherein the first voltage is different than the second voltage.

17. The method of claim 16, wherein the first voltage is a positive supply voltage and the second voltage is less than the positive supply voltage.

18. The method of claim 17, wherein the second voltage is less than the positive supply voltage by a transistor threshold voltage of the second transistor.

19. The method of claim 17, wherein the first internal power supply line provides the first voltage to a first p-channel transistor of the memory cell, and the second internal power supply line provides the second voltage to a second p-channel transistor of the memory cell.

20. The method of claim 17, wherein the first write voltage is a periphery supply voltage and the second write voltage is a ground supply voltage, wherein the periphery supply voltage is less than the positive supply voltage and greater than the ground supply voltage.

21. The method of claim 20, further comprising precharging the first and second bit lines to the periphery supply voltage prior to establishing the first and second write voltages on the first and second bit lines.

22. The method of claim 16, wherein the first voltage is a ground supply voltage and the second voltage is greater than the ground supply voltage.

23. The method of claim 22, wherein the second voltage is greater than the ground supply voltage by a transistor threshold voltage of the second transistor.

24. The method of claim 22, wherein the first internal power supply line provides the first voltage to a first n-channel transistor of the memory cell, and the second internal power supply line provides the second voltage to a second n-channel transistor of the memory cell.

25. The method of claim 16, wherein the memory cell is powered from a positive supply voltage, wherein the first write voltage is a periphery supply voltage and the second write voltage is a ground supply voltage, wherein the periphery supply voltage is less than the positive supply voltage and greater than the ground supply voltage.

26. The method of claim 25, further comprising precharging the first and second bit lines to the periphery supply voltage prior to establishing the first and second write voltages on the first and second bit lines.

* * * * *

UNITED STATES PATENT AND TRADEMARK OFFICE
CERTIFICATE OF CORRECTION

PATENT NO. : 9,865,334 B2  
APPLICATION NO. : 15/367710  
DATED : January 9, 2018  
INVENTOR(S) : Dharmesh Kumar Sonkar

Page 1 of 1

It is certified that error appears in the above-identified patent and that said Letters Patent is hereby corrected as shown below:

On the Title Page

Column 1, item (71), should read:  
(71) Applicant: Synopsys, Inc., Mountain View, CA (US)

Signed and Sealed this  
Tenth Day of May, 2022

Katherine Kelly Vidal  
*Director of the United States Patent and Trademark Office*